US006610192B1

(12) United States Patent
Step et al.

(10) Patent No.: US 6,610,192 B1
(45) Date of Patent: Aug. 26, 2003

(54) COPPER ELECTROPLATING

(75) Inventors: Eugene N. Step, Newton, MA (US); Robert A. Binstead, Marlborough, MA (US); Denis Morrissey, Huntington, NY (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/002,281

(22) Filed: Nov. 2, 2001

Related U.S. Application Data
(60) Provisional application No. 60/245,310, filed on Nov. 2, 2000.

(51) Int. Cl.$^7$ ................................................ C25D 3/38
(52) U.S. Cl. ...................................... 205/297; 205/298
(58) Field of Search ................................. 205/297, 298

(56) References Cited

U.S. PATENT DOCUMENTS

| | | | |
|---|---|---|---|
| 4,038,161 A | * 7/1977 | Eckles et al. ............. 204/52 R |
| 5,252,196 A | 10/1993 | Sonnenberg et al. ........ 205/296 |
| 5,607,570 A | 3/1997 | Rohbani ..................... 205/297 |
| 6,024,857 A | 2/2000 | Reid .......................... 205/123 |
| 6,183,622 B1 | 2/2001 | Janik .......................... 205/585 |

FOREIGN PATENT DOCUMENTS

| | | |
|---|---|---|
| DE | 196 43 091 A1 | 10/1996 |
| WO | WO 99/31300 | 6/1999 |

OTHER PUBLICATIONS

English language translation of previously cited German Application No. DE 196 43 091 A1, filed Oct. 18, 1996.

* cited by examiner

*Primary Examiner*—Edna Wong
(74) *Attorney, Agent, or Firm*—S. Matthew Cairns

(57) ABSTRACT

Disclosed are compositions and methods for providing a planarized metal layer on a substrate having small apertures. The compositions and methods of the present invention provide complete fill of small apertures with reduced void formation.

14 Claims, 5 Drawing Sheets

COPPER ELECTROPLATING

This application claims the benefit of U.S. Provisional Application(s) No(s).: No. 60/245,310 filing date of Nov. 2, 2000.

BACKGROUND OF THE INVENTION

The present invention relates generally to the field of electrolytic plating compositions. In particular, the present invention relates to the field of copper electroplating compositions.

Methods for electroplating articles with metal coatings generally involve passing a current between two electrodes in a plating solution where one of the electrodes is the article to be plated. A typical acid copper plating solution comprises dissolved copper (usually copper sulfate), an acid electrolyte such as sulfuric acid in an amount sufficient to impart conductivity to the bath, and proprietary additives to improve the uniformity of the plating and the quality of the metal deposit. Such additives include brighteners, levelers, surfactants, suppressants, and the like.

Electrolytic copper plating solutions are used for many industrial applications. For example, they are used in the automotive industry to deposit base layers for subsequently applied decorative and corrosion protective coatings. They are also used in the electronics industry, particularly for the fabrication of printed circuit boards and semiconductors. For circuit board fabrication, copper is electroplated over selected portions of the surface of a printed circuit board and onto the walls of through holes passing between the surfaces of the circuit board base material. The walls of a through hole are first metallized to provide conductivity between the board's circuit layers. For semiconductor fabrication, copper is electroplated over the surface of a wafer containing a variety of features such as vias, trenches or a combination thereof. The vias and trenches are metallized to provide conductivity between various layers of the semiconductor device.

It is well known in certain areas of plating, such as in electroplating of printed circuit boards, that the use of brighteners and/or levelers in the electroplating bath can be crucial in achieving a uniform metal deposit on a substrate surface. Plating a substrate having irregular topography can pose particular difficulties. During electroplating a voltage drop variation typically will exist along an irregular surface which can result in an uneven metal deposit. Plating irregularities are exacerbated where the voltage drop variation is relatively extreme, i.e., where the surface irregularity is substantial. As a result, a thicker metal deposit, termed overplating, is observed over such surface irregularities. Consequently, high quality metal plating (e.g., a metal layer or plate of substantially uniform thickness) is frequently a challenging step in the manufacture of electronic devices.

In the manufacture of printed circuit boards, the use of levelers, or leveling agents, in copper electroplating baths is well known. Such levelers are typically organic compounds that are added to the electroplating bath to provide substantially uniform copper layers. For example, U.S. Pat. No. 5,252,196 (Sonnenberg et al.) discloses the use of certain leveling agents containing a group of the formula N—R—S for use in the manufacture of printed wiring boards, where the leveling agent is present in an amount of less than 1 ppm. The manufacture of semiconductors is not disclosed.

The use of leveling agents in semiconductor manufacture is known but such agents are known to provide poor fill performance of small features, such as vias and trenches. For example, known leveling agents that have been used in semiconductor manufacture form substantially planar surfaces however, they also form a substantial number of voids in the vias or trenches. Such voids can cause electrical open circuits in the semiconductor. As the geometries of electronic devices get smaller, the difficulty of plating a uniform copper layer while completely filling the smaller features becomes more difficult.

One proposed solution is that found in U.S. Pat. No. 6,024,857 (Reid) which discloses the use of certain leveling agents in the copper electroplating of wafers. In this patent, the leveling agents are selected such that they consist essentially of molecules having a size at least equal to the width of the feature to be plated. Such leveling agents are macromolecules, having molecular weights of from 200,000 to 10,000,000. Such an approach is problematic when features of different sizes are present in the same substrate. Also, such leveling agents are so large that they are removed from the plating baths during normal filtration processes to remove particulates.

Thus, there is a need in the art for leveling agents for use in semiconductor manufacture that do not form voids, show reduced overplating and are useful for plating substrates having different sized features.

U.S. Pat. No. 4,038,161 (Eckles et al.) discloses a method of producing level copper deposits by electroplating copper from a copper plating bath containing at least one organic leveling compound obtained by reacting one or more epihalohydrins with one or more nitrogen containing compounds selected from certain substituted pyridines, quinolione or aminoquinoline, isoquinoline or benimidazole. Reaction products of imidazoles are not disclosed. This patent fails to disclose the copper plating of small features in substrates used in the manufacture of integrated circuits.

German patent application DE 196 43 091 A (assigned to Raschig GmbH) claims a reagent for metallic or metallized surfaces containing a water-soluble reaction product of a water-soluble polyamidoamine and/or polyamine with epihalohydrin. Copper plating baths containing the reaction product of epichlorohydrin with imidazole are disclosed. This patent application fails to disclose the deposition of copper on a substrate having small features, such as a substrate used in the manufacture of integrated circuits.

U.S. Pat. No. 5,607,570 (Rohbani) discloses an alkaline copper electroplating solution containing a reaction product of an amine, such as imidazole, with epichlorohydrin. The pH of the plating bath is from 9 to 14. The amine-epichlorohydrin reaction product is used in this patent to prevent the build-up of iron contamination in solution during electroplating. Acid copper plating baths are not disclosed in this patent. This patent also fails to disclose the copper plating of integrated circuit substrates.

SUMMARY OF THE INVENTION

It has been surprisingly found that the present invention provides metal layers, particularly copper layers, having reduced overplating. The metal layers provided by the present invention are substantially planar, even on substrates having very small features. It has been further surprisingly found that the present invention provides metal layers substantially without the formation of added defects, such as voids, in the features, and in particular copper layers without the formation of defects, such as voids, in very small features.

In one aspect, the present invention provides a composition for the electroplating of copper on an integrated circuit device comprising electrolyte, one or more sources of copper ions, one or more brighteners and one or more leveling agents capable of providing a substantially planar copper layer and filling small features without substantially forming defects, wherein the brightener is present in an amount of at least about 1 mg/L, based on the bath, and wherein at least one leveling agent is a reaction product of a heterocyclic amine with an epihalohydrin.

In another aspect the present invention provides a method of electroplating copper on a substrate having $\leq 2$ μm apertures comprising the steps of contacting a substrate to be plated with a copper electroplating bath comprising one or more leveling agents capable of providing a substantially planar copper layer and filling $\leq 2$ μm apertures without substantially forming defects, and subjecting the bath to a current density and for a period of time sufficient to deposit a copper layer on the substrate, wherein at least one leveling agent is a reaction product of a heterocyclic amine with an epihalohydrin.

In still another aspect, the present invention provides a method of manufacturing an electronic device comprising the steps of contacting an electronic device substrate having $\leq 2$ μm apertures with a copper electroplating bath comprising one or more leveling agents capable of providing a substantially planar copper layer and filling $\leq 2$ μm apertures without substantially forming defects, and subjecting the bath to a current density and for a period of time sufficient to deposit a copper layer on the substrate, wherein at least one leveling agent is a reaction product of a heterocyclic amine with an epihalohydrin.

In a further aspect, the present invention provides a method of reducing overplating in a copper layer of an integrated circuit device comprising the steps of contacting an integrated circuit substrate with a copper electroplating bath comprising one or more leveling agents capable of providing a substantially planar copper layer and filling $\leq 2$ μm apertures without substantially forming defects, and subjecting the bath to a current density and for a period of time sufficient to deposit a copper layer on the substrate, wherein at least one leveling agent is a reaction product of an amine with an epihalohydrin.

In a still further aspect, the present invention provides a method of providing a copper layer having reduced overplating on an integrated circuit device comprising the steps of: contacting an integrated circuit substrate with a copper electroplating bath including electrolyte, one or more sources of copper ions, one or more brighteners and one or more leveling agents capable of providing a substantially planar copper layer and filling $\leq 2$ μm apertures without substantially forming defects; and subjecting the bath to a current density and for a period of time sufficient to deposit a copper layer on the substrate; wherein the substrate comprises one or more apertures having a size of $\leq 2$ μm; and wherein at least one leveling agent is a reaction product of a heterocyclic amine and an epihalohydrin.

DETAILED DESCRIPTION OF THE INVENTION

Figure 1:
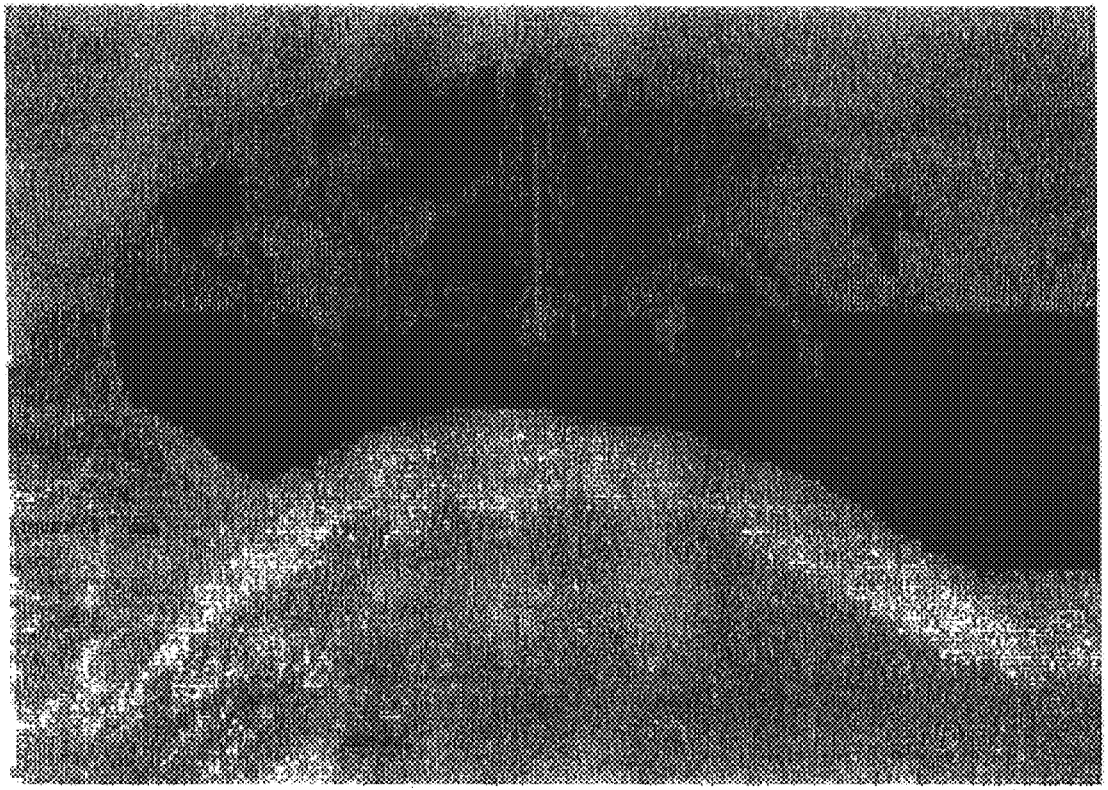
FIG. 1 is a FIB micrograph of a prior art sample showing overplating of copper on 0.2 μm trenches.

As used throughout this specification, the following abbreviations shall have the following meanings, unless the context clearly indicates otherwise: A=amperes; mA/cm$^2$= milliamperes per square centimeter; ° C.=degrees Centigrade; g=gram; mg=milligram; Å=angstrom; L=liter, ppm= parts per million; ppb=parts per billion; μm=micron= micrometer; cm=centimeter; RPM=revolutions per minute; DI=deionized; and mL=milliliter. All amounts are percent by weight and all ratios are by weight, unless otherwise noted. All numerical ranges are inclusive and combinable.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller (<1 μm) in size and "very small apertures" refer to apertures that are one-half micron or smaller (<0.5 μm) in size. As used throughout this specification, the term "plating" refers to metal electroplating, unless the context clearly indicates otherwise. "Deposition" and "plating" are used interchangeably throughout this specification. "Halide" refers to fluoride, chloride, bromide and iodide. Likewise, "halo" refers to fluoro, chloro, bromo and iodo. The term "alkyl" includes linear, branched and cyclic alkyl. "Brightener" refers to an organic additive that increases the plating rate of the electroplating bath. The terms "brightener" and "accelerator" are used interchangeably throughout this specification. "Leveler" refers to an organic compound that is capable of providing a substantially planar metal layer. The terms "levelers" and "leveling agents" are used interchangeably throughout this specification.

The present invention provides a plated metal layer, particularly a plated copper layer, on a substrate containing small features wherein the metal layer has reduced overplating and the small features are substantially free of added voids, and preferably substantially free of voids. "Overplating" refers to a thicker metal deposit over dense feature areas as compared to areas free of features or at least containing relatively few features. The term "relatively few features" means an area containing up to 10% of the features of a comparative area, and preferably up to 5%. Such difference in the plating thickness over dense feature areas as compared to the plating thickness over areas free of features or containing relatively few features is referred to as "step height."

Suitable substrates are any used in the manufacture of electronic devices, such as integrated circuits. Such substrates typically contain a number of features, particularly apertures, having a variety of sizes. Particularly suitable substrates are those having $\leq 2$ μm apertures. Particularly suitable substrates are wafers used in semiconductor manufacture, and more particularly wafers used in dual damascene manufacturing processes. It is preferred that the substrate contains small features, and preferably very small features. The present invention is particularly suited for use in plating substrates having sub-half-micron features or smaller, more particularly 0.3 micron features or smaller and most particularly 0.25 micron features or smaller. It is further preferred that the small features are free of added voids. The present invention is particularly suitable for filling high aspect ratio vias and trenches, such as those having aspect ratios of 4:1 or greater such as 10:1, and particularly high aspect ratio trenches, with copper such that the vias or trenches are substantially free of voids and preferably free of voids. It will be appreciated by those skilled in the art that the present invention is also useful in filling features that are greater than 2 microns. It will be further appreciated by those skilled in the art that suitable substrates may have apertures that are $\leq 2$ µm in size as well as other apertures that are >2 µm in size.

The present invention is achieved by combining one or more leveling agents capable of providing a substantially planar copper layer and filling $\leq 2$ µm features without substantially forming defects, such as but not limited to voids, with a metal electroplating bath, preferably a copper electroplating bath. Suitable leveling agents are reaction products of an amine, particularly a heterocyclic amine, with an epihalohydrin. It will be appreciated by those skilled in the art that more than one amine may be used in the reaction as well as more than one epihalohydrin. Suitable heterocyclic amines include, but are not limited to, imidazole, triazole, tetrazole, piperidine, morpholine, piperazine and the like. Imidazole is the preferred heterocyclic amine. Suitable epihalohydrins include epichlorohydrin. The reaction products need not be, but typically are, polymeric compounds. Such reaction products may have a wide range of molecular weights. Such reaction products are generally commercially available from a number of suppliers, e.g. Raschig GmbH, Ludwigshafen, Germany.

The reaction product is prepared by reacting, for example, epichlorohydrin with the heterocyclic amine under any suitable reaction conditions. In one method, both the heterocyclic amine and epichlorohydrin are dissolved in the same solvent in desired concentrations and reacted, such as for 40 to 240 minutes. The solvent is typically removed, such as under vacuum, to provide a water-soluble reaction product. A wide range of ratios of heterocyclic amine to epichlorohydrin can be used, such as from 0.5:1 to 2:1. It is preferred that the ratio of heterocyclic amine to epichlorohydrin is 0.6:1 to 2:1, more preferably 0.7 to 1:1, and still more preferably 1:1.

In general, the present metal electroplating baths include electrolyte, preferably acidic electrolyte, one or more sources of metal ions, one or more brighteners and optionally other additives. Such baths are typically aqueous. Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid and the like. The acids are typically present in an amount in the range of from about 1 to about 300 g/L, and preferably from about 150 to about 250 g/L.

For certain applications, such as in the plating of wafers having very small apertures, it is preferred that the total amount of added acid be low. By "low acid" is meant that the total amount of added acid in the electrolyte is less than about 0.4 M, preferably less than about 0.3 M, and more preferably less than about 0.2 M.

Such electrolytes may optionally contain a source of halide ions, such as chloride ions such as copper chloride or hydrochloric acid. A wide range of halide ion concentrations may be used in the present invention. Typically, the halide ion concentration is in the range of from about 0 to about 100 ppm based on the plating bath, and preferably from about 25 to about 75 ppm. It is preferred that the electrolyte is sulfuric acid, and preferably a mixture of sulfuric acid and a source of chloride ions. The acids and sources of halide ions useful in the present invention are generally commercially available and may be used without further purification.

Any metal ion source that is at least partially soluble in the electroplating bath is suitable. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of metal ions is copper sulfate, copper chloride, copper acetate, copper nitrate, copper fluoroborate, copper methane sulfonate, copper phenyl sulfonate and copper p-toluene sulfonate. Copper sulfate pentahydrate is particularly preferred. Such metal salts are generally commercially available and may be used without further purification.

The metal salts may be used in the present invention in any amount that provides sufficient metal ions for electroplating on a substrate. Suitable metal salts include, but are not limited to, tin salts, copper salts, and the like. When the metal is copper, the copper salt is typically present in an amount in the range of from about 10 to about 300 g/L of plating solution, preferably from about 25 to about 200 g/L, and more preferably from about 40 to about 175 g/L. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depends upon the particular alloy to be plated and is well known to those skilled in the art.

Any brighteners or brightening agents are suitable for use in the present invention. Typical brighteners contain one or more sulfur atoms and have a molecular weight of about 1000 or less. Brightener compounds that have sulfide and/or sulfonic acid groups are generally preferred, particularly compounds that include a group of the formula R'—S—R—SO$_3$X, where R is optionally substituted alkyl, optionally substituted heteroalkyl, optionally substituted aryl, or optionally substituted heterocyclic; X is a counter ion such as sodium or potassium; and R' is hydrogen or a chemical bond. Typically, the alkyl groups are ($C_1$–$C_{16}$)alkyl and preferably ($C_3$–$C_{12}$)alkyl. Heteroalkyl groups typically have one or more heteroatoms, such as nitrogen, sulfur or oxygen, in the alkyl chain. Suitable aryl groups include, but are not limited to, phenyl, benzyl, biphenyl and naphthyl. Suitable heterocyclic groups typically contain from 1 to about 3 heteroatoms, such as nitrogen, sulfur or oxygen, and 1 to 3 separate or fused ring systems. Such heterocyclic groups may be aromatic or non-aromatic. Specific brighteners suitable for use in the present invention include, but are not limited to, N,N-dimethyl-dithiocarbamic acid-(3-sulfopropyl)ester; 3-mercapto-propylsulfonic acid-(3-sulfopropyl)ester; 3-mercaptopropylsulfonic acid sodium salt; carbonic acid-dithio-o-ethylester-s-ester with 3-mercapto-1-propane sulfonic acid potassium salt; bis-sulfopropyl disulfide; 3-(benzothiazolyl-s-thio) propylsulfonic acid sodium salt; pyridinium propyl sulfobetaine; 1-sodium-3-mercaptopropane-1-sulfonate; and the like.

Such brighteners are typically used in an amount of at least about 1 mg/L, based on the bath, preferably at least about 1.2 mg/L, and more preferably at least about 1.5 mg/L. For example, the brighteners are present in an amount of from about 1 mg/L to about 200 mg/L. Particularly suitable amounts of brightener useful in the present invention are at least about 2 mg/L, and more particularly at least about 4 g/L. Even higher brightener concentrations are preferred, such as at least about 10, 15, 20, 30, 40 or 50 mg/L, based on the bath.

The leveling agents useful in the present invention are any which are capable of providing a substantially planar copper layer and filling small features without substantially forming voids and are reaction products of a heterocyclic amine with an epihalohydrin. Preferred leveling agents include reaction products of imidazole with epichlorohydrin. Such heterocyclic amines or epihalohydrins may further include additional heteroatoms, such as sulfur, nitrogen and oxygen.

It will be appreciated by those skilled in the art that more than one leveling agent may be used. When two or more leveling agents are used, at least one of the leveling agents is a reaction product of an amine with an epoxide. Suitable additional leveling agents include, but are not limited to, one or more of nigrosines, pentamethyl-para-rosaniline hydrohalide, hexamethyl-pararosaniline hydrohalide, or compounds containing a functional group of the formula N—R—S, where R is a substituted alkyl, unsubstituted alkyl, substituted aryl or unsubstituted aryl. Typically, the alkyl groups are $(C_1-C_6)$alkyl and preferably $(C_1-C_4)$alkyl. In general, the aryl groups include $(C_6-C_{20})$aryl, preferably $(C_6-C_{10})$aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, $(C_1-C_{12})$alkyl, $(C_2-C_{12})$alkenyl, $(C_6-C_{20})$aryl, $(C_1-C_{12})$alkylthio, $(C_2-C_{12})$alkenylthio, $(C_6-C_{20})$arylthio and the like. Likewise, the nitrogen will have one or more substituent groups, such as but not limited to hydrogen, $(C_1-C_{12})$alkyl, $(C_2-C_{12})$alkenyl, $(C_7-C_{10})$aryl, and the like. The N—R—S functional group may be acyclic or cyclic. Compounds containing cyclic N—R—S functional groups include those having either the nitrogen or the sulfur or both the nitrogen and the sulfur within the ring system.

By "substituted alkyl" is meant that one or more of the hydrogens on the alkyl group is replaced with another substituent group, such as, but not limited to, cyano, hydroxy, halo, $(C_1-C_6)$alkoxy, $(C_1-C_6)$alkylthio, thiol, nitro, and the like. By "substituted aryl" is meant that one or more hydrogens on the aryl ring are replaced with one or more substituent groups, such as, but not limited to, cyano, hydroxy, halo, $(C_1-C_6)$alkoxy, $(C_1-C_6)$alkyl, $(C_2-C_6)$alkenyl, $(C_1-C_6)$alkylthio, thiol, nitro, and the like. "Aryl" includes carbocyclic and heterocyclic aromatic systems, such as, but not limited to, phenyl, naphthyl and the like.

The leveling agents of the present invention are typically used in a total amount of from about 0.5 ppm to about 50 ppm based on the total weight of the plating bath, although greater amounts may be used. It is preferred that the total amount of leveling agent is from about 1 to about 25 ppm and more preferably from about 2 to about 20 ppm. It is preferred that as the amount of leveling agent is increased in the plating bath that the amount of brightener is also increased. Amounts of leveling agent greater than about 1 ppm are particularly useful in certain plating baths.

The electroplating baths of the present invention may include one or more optional additives. Such optional additives include, but are not limited to, suppressors, surfactants and the like. Such suppressors and brighteners are generally known in the art. It will be clear to one skilled in the art which suppressors and/or brighteners to use and in what amounts.

Suppressors useful in the present invention include, but are not limited to, polymeric materials, particularly those having heteroatom substitution, and more particularly oxygen substitution. It is preferred that the suppressor is a high molecular weight polyether, such as those of the formula:

where R is a $(C_2-C_{20})$alkyl group or $(C_6-C_{10})$aryl group; each of X, Y, X' and Y' is independently selected from hydrogen, alkyl such as methyl, ethyl or propyl, aryl such as phenyl, or aralkyl such as benzyl; and n is an integer from 5 to 100,000. It is preferred that one or more of X, Y, X' and Y' is hydrogen. It is further preferred that R is ethylene. It is more preferred that R is ethylene and n is greater than 12,000. Particularly suitable suppressors include commercially available polyethylene glycol copolymers, including ethylene oxide-propylene oxide copolymers and butyl alcohol-ethylene oxide-propylene oxide copolymers. Suitable butyl alcohol-ethylene oxide-propylene oxide copolymers are those having a weight average molecular weight of about 1800.

When suppressors are used, they are typically present in an amount in the range of from about 1 to about 10,000 ppm based on the weight of the bath, and preferably from about 5 to about 10,000 ppm.

Particularly suitable compositions useful as electroplating baths in the present invention include one or more soluble copper salts, one or more acids, one or more leveling agents and one or more brighteners, wherein the brighteners are present in a concentration of at least about 1 mg/L of the bath. More particularly suitable compositions include about 10 to about 300 g/L of one or more soluble copper salts, about 150 to about 250 g/L of one or more acids, about 25 to about 75 ppm of a halide ion, about 0.1 to about 10 ppm of a reaction product of imidazole with epichlorohydrin, wherein the brighteners are present in a concentration of at least about 1 mg/L of the bath. It is preferred that these compositions further contain a suppressor. It is further preferred that the suppressor is present in an amount of from about 5 to about 10,000 ppm. The ratio of imidazole to epichlorohydrin used to form the reaction product is preferably about 1:1.

The electroplating baths of the present invention may be prepared by combining the components in any order. It is preferred that the inorganic components such as metal salts, water, acid and optional halide ion source, are first added to the bath vessel followed by the organic components such as leveling agents, brighteners, suppressors, surfactants and the like.

Typically, the plating baths of the present invention may be used at any temperature from about 10° to about 65° C. or higher. It is preferred that the temperature of the plating baths is from 10° to 35° C. and more preferably from 15° to 30° C.

In general, when the present invention is used to deposit metal on a substrate such as a wafer used in the manufacture of an integrated circuit, the plating baths are agitated during use. Any suitable agitation method may be used with the present invention. Suitable agitation methods include, but are not limited to, air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Typically, substrates are electroplated by contacting the substrate with the plating baths of the present invention. Typically, the bath is subjected to a current density for a period of time sufficient to deposit a copper layer on the substrate. Suitable current densities, include, but are not limited to, the range of about 1 to about 40 mA/cm$^2$. It is preferred that the current densities are from about 3 to about 30 mA/cm$^2$. The specific current density depends upon the substrate to be plated, the leveling agent selected and the like. Such current density choice is within the skill of one in the art.

The present invention may be used to electroplate a variety of electronic device substrates, particularly those having small apertures. For example, the present invention is particularly suitable for depositing copper on integrated circuit substrates, such as semiconductor devices, with small diameter, high aspect ratio vias, trenches or other apertures. It is preferred that semiconductor devices are plated according to the present invention. Such semiconductor devices include, but are not limited to, wafers used in the manufacture of integrated circuits.

In particular, the present invention provides a method for manufacturing an integrated circuit device comprising the steps of: a) providing at least one of vias or trenches in an integrated circuit device substrate having a conductive layer wherein the at least one via or trench has a size of $\leq 2$ $\mu$m; and b) electrolytically plating a copper layer over the conductive layer using an electrolytic plating bath comprising one or more soluble copper salts, one or more acids, one or more leveling agents capable of providing a substantially planar metal layer and filling $\leq 2$ $\mu$m features without substantially forming voids, and one or more brighteners, wherein the brighteners are present in a concentration of at least about 1 mg/L of the bath, and wherein at least one leveling agent is a reaction product of a heterocyclic amine with an epihalohydrin. More particularly, the present invention provides a method for manufacturing an integrated circuit device comprising the steps of: a) providing at least one of vias or trenches in an integrated circuit substrate having a conductive layer wherein the at least one via or trench has a size of $\leq 2$ $\mu$m; and b)electrolytically plating a copper layer over the conductive layer using an electrolytic plating bath including 10 to about 300 g/L of one or more soluble copper salts, about 100 to about 300 g/L of one or more acids, about 25 to about 75 ppm of a halide ion, about 0.1 to about 10 ppm of one or more leveling agents, wherein the brighteners are present in a concentration of at least about 1 mg/L of the bath, and wherein at least one leveling agent is a reaction product of a heterocyclic amine with an epihalohydrin. By the term "without substantially forming voids" it is meant that >95% of the plated features are void-free. It is preferred that the plated features are void-free.

While the process of the present invention has been generally described with reference to semiconductor manufacture, it will be appreciated that the present invention may be useful in any electrolytic process where reduced overplating and metal filled small features that are substantially free of voids are desired. Such processes include printed wiring board manufacture.

An advantage of the present invention is that overplating is reduced or substantially eliminated. Such reduced overplating means less time and effort is spent in removing metal, such as copper, during subsequent chemical-mechanical polishing ("CMP") process, particularly in semiconductor manufacture. A further advantage of the present invention is that a wide range of apertures sizes may be fill within a single substrate with substantially no suppressed local plating. Thus, the present invention is particularly suitable to substantially filling apertures in a substrate having a variety of aperture sizes, such as from 0.18 $\mu$m to about 2 $\mu$m.

Thus, electronic devices including substrates, such as semiconductor devices, wafers, printed circuit boards and the like, are formed according to the present invention having substantially planar copper layers and filled small features that are substantially free of added defects, wherein the copper layer has not been subjected to polishing processes, such as CMP process. By "substantially planar" copper layer is meant that the step height difference between areas of dense very small features and areas free of or substantially free of very small features is less than 1 $\mu$m, preferably less than 0.75 $\mu$m, more preferably less than 0.6 $\mu$m, and even more preferably less than 0.1 $\mu$m. "Substantially free of added defects" refers to the leveling agent not increasing the number or size of defects, such as voids, in very small features as compared to control plating baths not containing such leveling agent. A further advantage of the present invention is that a substantially planar metal layer may be deposited on a substrate having non-uniformly sized small features, wherein the features are substantially free of added voids, with the use of a single leveling agent. "Non-uniformly sized small features" refer to small features having a variety of sizes in the same substrate. Thus, the need to tailor the leveling agent to the size of the feature to be filled is avoided.

The following examples are intended to illustrate further various aspects of the present invention, but are not intended to limit the scope of the invention in any aspect.

EXAMPLE 1

Patterned 8 inch (ca. 20.3 cm) wafers, i.e. wafers having no features, having a 250 Å tantalum barrier layer and a 1000 Å physical vapor deposited ("PVD") copper seed layer were plated in a copper bath containing 175 g/L sulfuric acid, 17.5 g/L copper ions as copper sulfate, 50 ppm chloride ions as hydrochloric acid, 800 ppm of an EO/PO copolymer having a molecular weight of 2400, and 1 mL/L of solution of bis-sodium-sulfonopropyl-disulfide as brightener. The wafer contained 0.2 $\mu$m, 0.3 $\mu$m, 1 $\mu$m and 2 $\mu$m trenches. A control wafer was plated using this bath containing no leveling agent. FIG. 1 is a FIB micrograph of the Control Wafer showing overplating of copper on 0.2 $\mu$m trenches.

EXAMPLE 2

A comparative wafers ("Comparative") was plated with the bath of Example 1 except that the bath contained 3 mL/L of solution of brightener and 0.9 ppm of 1-(2-hydroxyethyl)-2-imidazolidinethione as leveling agent. The wafers were electrically attached to a cathode and the plating solution was pumped onto the surface of the wafer while rotating at upwards of 20 RPM. The following rectification sequence was used to plated the wafers: Step 1: 1.0 A current and 0.08 A-min total charge; Step 2: 4.5 A current and 4.40 A-min total charge; and Step 3: 6.0 A current and 10.5 A-min total charge. The wafers were plated at 25° C.

Figure 2:
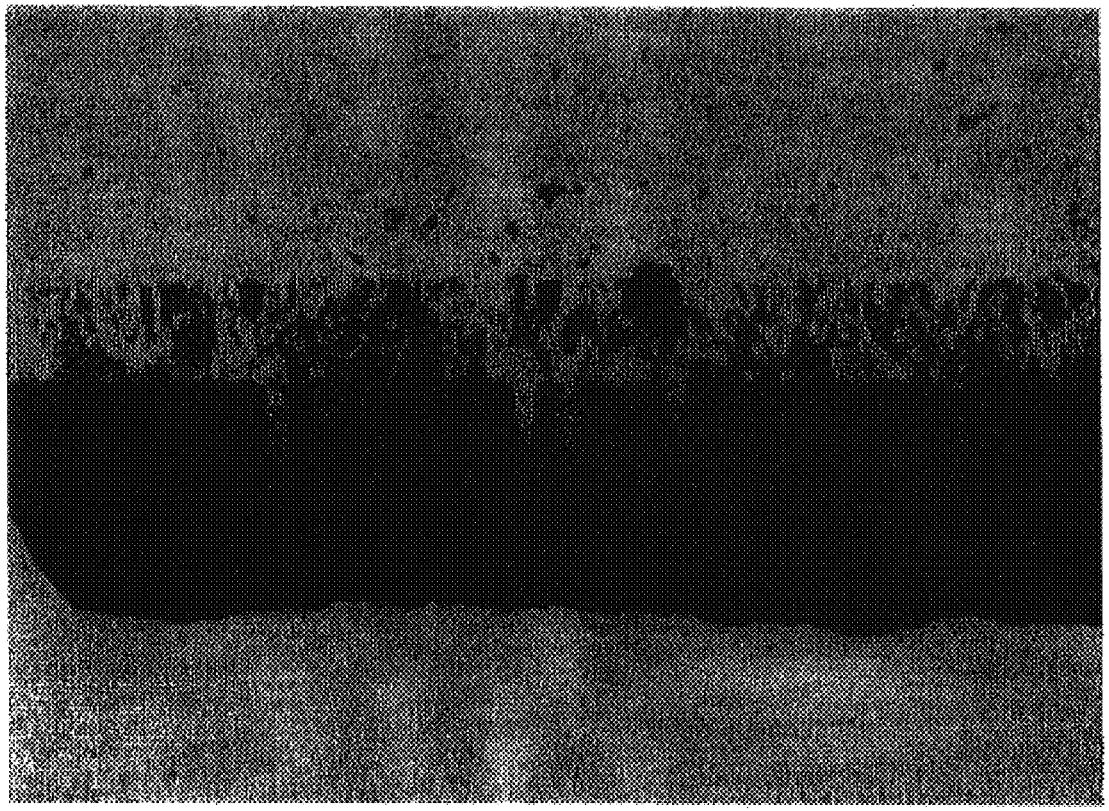
FIG. 2 is a FIB micrograph of a prior art sample showing substantially no overplating of copper over dense 0.2 μm trenches.
Figure 3:
FIG. 3 is a FIB micrograph of a prior art sample showing suppressed local plating over 2 μm trenches.

FIG. 2 is a FIB micrograph of the comparative wafer showing substantially no overplating of copper on 0.2 µm trenches. FIG. 3 is a micrograph of the comparative wafer showing suppressed local plating of copper over 2 µm trenches. These data clearly show that this leveling agent does not provide substantially planar surfaces over a wide range of feature sizes.

EXAMPLE 3

A wafer ("Invention") was plated with the bath of Example 1 except that the bath contained 10 mL/L of solution of brightener and 7 mL/L of a reaction product of imidazole with epichlorohydrin (in a ratio of about 1:1) as leveling agent. The wafers were electrically attached to a cathode and the plating solution was pumped onto the surface of the wafer while rotating at upwards of 20 RPM. The following rectification sequence was used to plated the wafers: Step 1: 1.0 A current and 0.08 A-min total charge; Step 2: 4.5 A current and 4.40 A-min total charge; and Step 3: 6.0 A current and 10.5 A-min total charge. The wafers were plated at 25° C.

Figure 4:
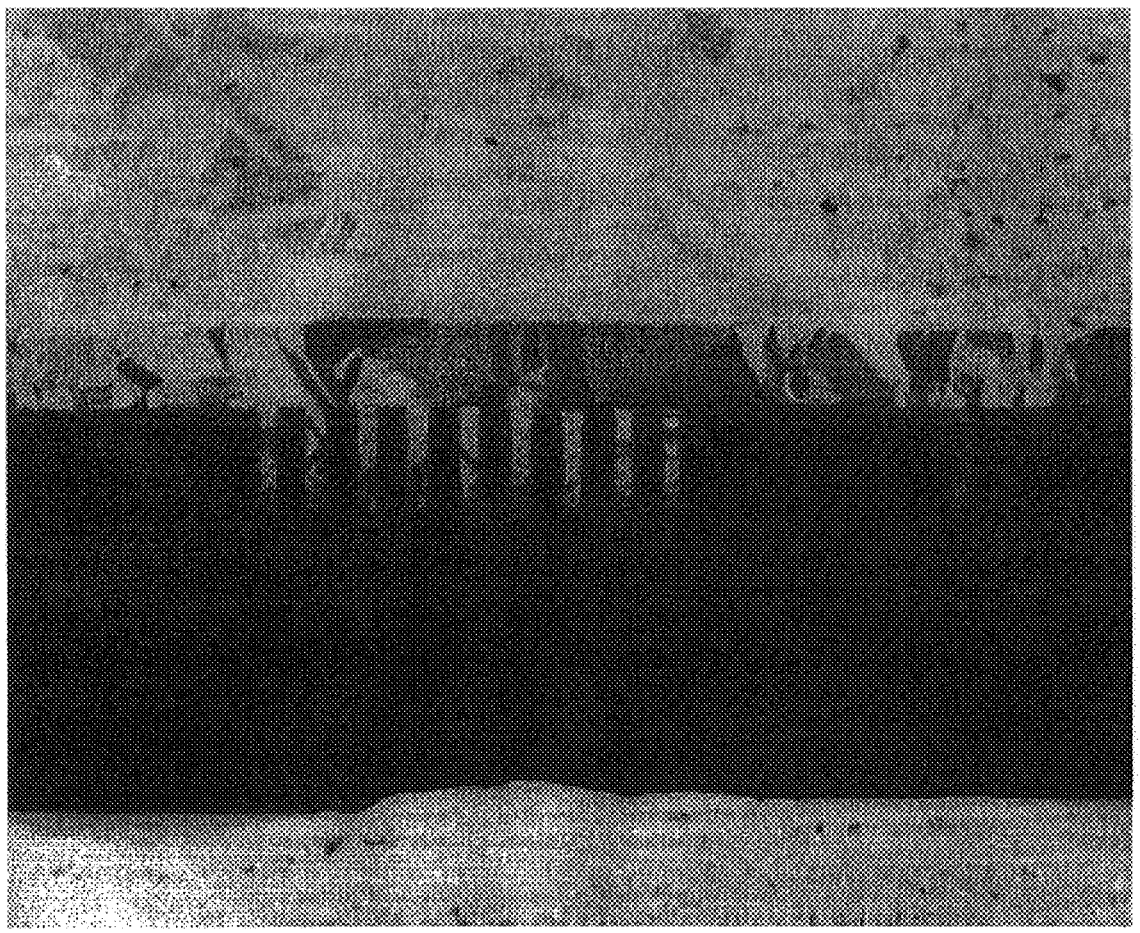
FIG. 4 is a FIB micrograph of a sample of the invention showing substantially no overplating of copper over dense 0.2 μm trenches.
Figure 5:
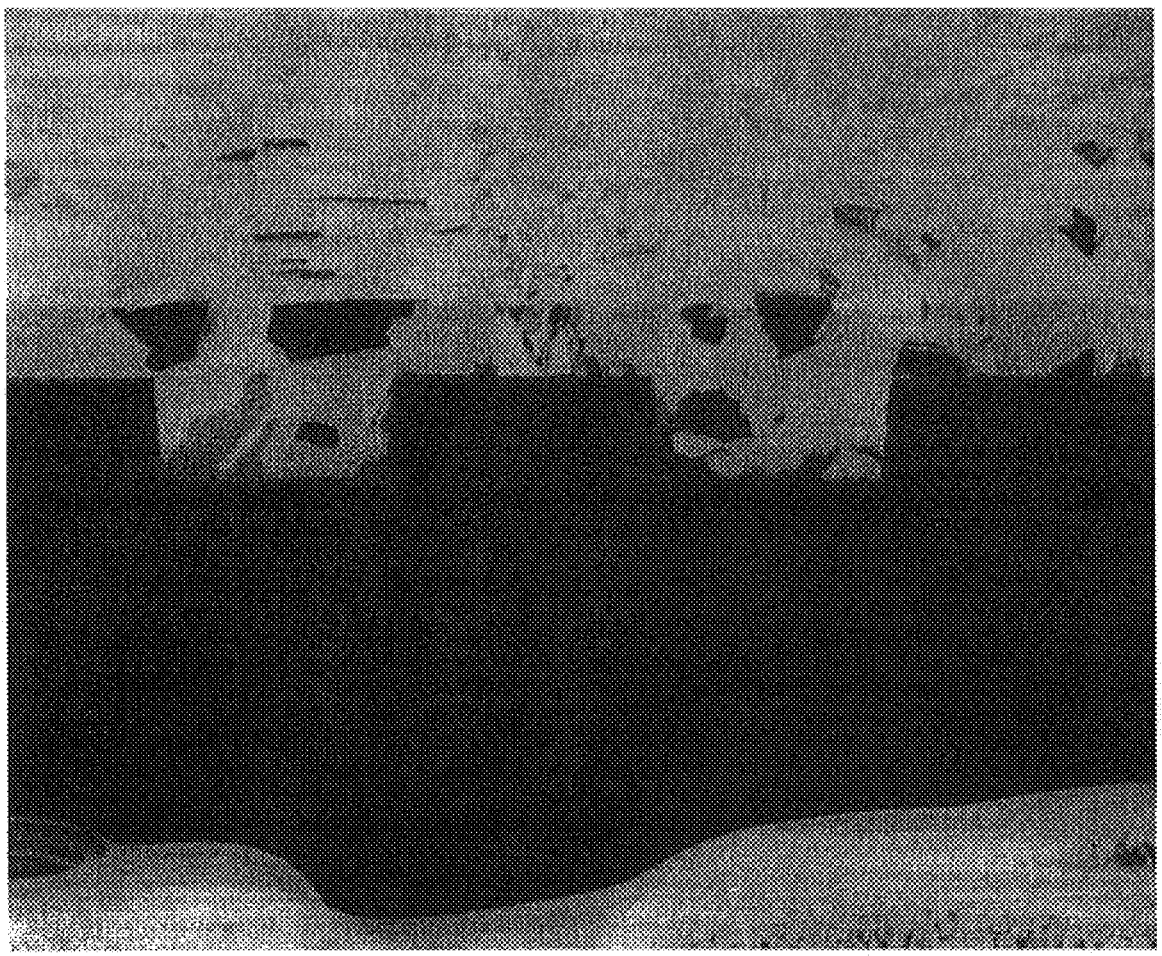
FIG. 5 is a FIB micrograph of a sample of the invention showing no suppressed local plating of copper over 2 μm trenches.

The results are shown in FIGS. 4 and 5. FIG. 4 is a FIB micrograph showing substantially no overplating of copper over dense 0.2 µm trenches. FIG. 5 is a FIB micrograph showing substantially no suppressed local plating of copper over 2 µm trenches.

What is claimed is:

1. A method of electroplating copper on an integrated circuit substrate having ≦2 µm apertures comprising the steps of contacting the substrate to be plated with a copper electroplating bath comprising one or more leveling agents; and subjecting the bath to a current density for a period of time sufficient to deposit a substantially planar copper layer on the substrate and fill the ≦2 µm apertures without substantially forming defects in the ≦2 µm apertures, wherein at least one leveling agent is a reaction product of a heterocyclic amine with an epihalohydrin.

2. The method of claim 1 wherein the leveling agent is present in an amount of from about 0.5 to about 50 ppm, based on the bath.

3. The method of claim 1 wherein the copper electroplating bath further comprises a source of halide ions.

4. The method of claim 1 wherein the copper electroplating bath further comprises an electrolyte selected from the group consisting of sulfuric acid, acetic acid, fluoroboric acid, alkylsulfonic acid, arylsulfonic acids, sulfamic acid, hydrochloric acid and phosphoric acid.

5. The method of claim 1 wherein the leveling agent is a reaction product of imidazole with epichlorohydrin.

6. A method of manufacturing an integrated circuit comprising the steps of contacting an integrated circuit substrate having ≦2 µm apertures with a copper electroplating bath comprising one or more leveling agents; and subjecting the bath to a current density for a period of time sufficient to deposit a substantially planar copper layer on the integrated circuit substrate and fill the ≦2 µm apertures without substantially forming defects in the ≦2 µm apertures, wherein at least one leveling agent is a reaction product of a heterocyclic amine with an epihalohydrin.

7. A method of reducing overplating in a copper layer of an integrated circuit device comprising the steps of contacting an integrated circuit substrate with a copper electroplating bath comprising one or more leveling agents; and subjecting the bath to a current density for a period of time sufficient to deposit a substantially planar copper layer and fill ≦2 µm apertures without substantially forming defects in the ≦2 µm apertures, wherein at least one leveling agent is a reaction product of an amine with an epihalohydrin.

8. The method of claim 7 wherein the copper electroplating bath comprises one or more brighteners wherein the brightener is present in an amount of at least about 1 mg/L, based on the bath.

9. The method of claim 7 wherein the leveling agent is a reaction product of imidazole with epichlorohydrin.

10. A method of providing a copper layer having reduced overplating on an integrated circuit device comprising the steps of: contacting an integrated circuit substrate comprising one or more apertures having a size of ≦2 µm with a copper electroplating bath comprising electrolyte, one or more sources of copper ions, one or more brighteners and one or more leveling agents; and subjecting the bath to a current density for a period of time sufficient to deposit a substantially planar copper layer and fill the ≦2 µm apertures without substantially forming defects in the ≦2 µm apertures; wherein at least one leveling agent is a reaction product of a heterocyclic amine and an epihalohydrin.

11. The method of claim 10 wherein the leveling agent is present in an amount of from about 0.5 to about 50 ppm, based on the bath.

12. The method of claim 10 wherein the copper electroplating bath further comprises a source of halide ions.

13. The method of claim 10 wherein the electrolyte is selected from the group consisting of sulfuric acid, acetic acid, fluoroboric acid, alkylsulfonic acid, arylsulfonic acids, sulfamic acid, hydrochloric acid and phosphoric acid.

14. The method of claim 10 wherein the leveling agent is a reaction product of imidazole with epichlorohydrin.

* * * * *